(12) United States Patent
Watzinger et al.

(10) Patent No.: US 12,065,729 B2
(45) Date of Patent: Aug. 20, 2024

(54) METAL COMPONENT AND METHOD FOR PRODUCING SAME

(71) Applicant: IWIS Motorsysteme Gmbh & CO. KG, Munich (DE)

(72) Inventors: Bernd Watzinger, Munich (DE); Matija Burger, Munich (DE)

(73) Assignee: IWIS MOTORSYSTEME GMBH & CO. KG, Munich (DE)

( * ) Notice: Subject to any disclaimer, the term of this patent is extended or adjusted under 35 U.S.C. 154(b) by 685 days.

(21) Appl. No.: 16/970,138

(22) PCT Filed: Feb. 14, 2019

(86) PCT No.: PCT/EP2019/053747
§ 371 (c)(1),
(2) Date: Aug. 14, 2020

(87) PCT Pub. No.: WO2019/158668
PCT Pub. Date: Aug. 22, 2019

(65) Prior Publication Data
US 2020/0399753 A1    Dec. 24, 2020

(30) Foreign Application Priority Data
Feb. 14, 2018  (DE) ...................... 10 2018 103 319.2

(51) Int. Cl.
*C23C 16/02* (2006.01)
*B21L 9/02* (2006.01)
(Continued)

(52) U.S. Cl.
CPC ............ *C23C 16/0272* (2013.01); *B21L 9/02* (2013.01); *B21L 15/00* (2013.01); *B22F 1/00* (2013.01);
(Continued)

(58) Field of Classification Search
CPC ... C23C 16/0272; C23C 16/34; C23C 24/082; B21L 9/02; B21L 15/00; B22F 1/00; F16G 15/12; F16G 13/06
See application file for complete search history.

(56) References Cited

U.S. PATENT DOCUMENTS 4,327,134 A    4/1982    Baldi
4,332,843 A    6/1982    Ahuja
(Continued)

FOREIGN PATENT DOCUMENTS

CN    101663503 A    3/2010
CN    102165087 A    8/2011
(Continued)

OTHER PUBLICATIONS

Machine Translation of CZ9904031A3 PDF File Name: "CZ9904031A3_Machine_Translation.pdf".*
(Continued)

*Primary Examiner* — Grant Moubry
*Assistant Examiner* — Ruben Picon-Feliciano
(74) *Attorney, Agent, or Firm* — Henry M. Feiereisen LLC (57) ABSTRACT

The invention relates to a method for producing a metal component coated by a hard-material coating, which method comprises the method steps of preparing an anti-caking agent, adding the prepared anti-caking agent to a powder mixture, providing the powder mixture, providing the substrate made of metal, heating the powder and the substrate in a heating device, depositing a coating on the substrate, the coating having a higher hardness than the substrate, and cooling the substrate.

5 Claims, 5 Drawing Sheets

(51) Int. Cl.
  *B21L 15/00* (2006.01)
  *B22F 1/00* (2022.01)
  *C23C 16/34* (2006.01)
  *C23C 24/08* (2006.01)
  *F16G 13/06* (2006.01)
  *F16G 15/12* (2006.01)

(52) U.S. Cl.
  CPC ............ *C23C 16/34* (2013.01); *C23C 24/082* (2013.01); *F16G 15/12* (2013.01); *F16G 13/06* (2013.01)

(56) References Cited

U.S. PATENT DOCUMENTS

| | | | |
|---|---|---|---|
| 5,108,983 | A | 4/1992 | Lackey, Jr. et al. |
| 2003/0195074 | A1 | 10/2003 | Kaga et al. |
| 2008/0020879 | A1 | 1/2008 | Nagao |
| 2010/0120567 | A1 | 5/2010 | Okumura et al. |
| 2014/0050932 | A1 | 2/2014 | Gierl et al. |
| 2015/0147523 | A1* | 5/2015 | Kumar .................... C23C 16/26 427/527 |
| 2015/0211603 | A1 | 7/2015 | Koschig et al. |
| 2016/0138516 | A1 | 5/2016 | Moding |
| 2017/0058997 | A1 | 3/2017 | Asada et al. |

FOREIGN PATENT DOCUMENTS

| | | | | |
|---|---|---|---|---|
| CN | 106480401 | A | 3/2017 | |
| CZ | 9904031 | A3 * | 11/2001 | ............... B22F 1/02 |
| DE | 103 16 484 | | 10/2003 | |
| DE | 102005047449 | | 9/2006 | |
| DE | 102006052869 | | 5/2008 | |
| DE | 102011006294 | | 10/2012 | |
| DE | 102014211366 | | 12/2014 | |
| DE | 102013222244 | | 4/2015 | |
| DE | 102016215709 | | 3/2017 | |
| EP | 0336197 | A2 | 10/1989 | |
| EP | 0 902 099 | | 3/1999 | |
| GB | 1373750 | A | 11/1974 | |
| JP | 3018804 | | 3/2000 | |
| JP | 2003-139199 | A | 5/2003 | |
| JP | 2008-025622 | A | 2/2008 | |
| WO | WO 2014/019699 | | 2/2014 | |

OTHER PUBLICATIONS

International Search Report issued by the European Patent Office in International Application PCT/EP2019/053747 on Mar. 28, 2019.
Wikipedia: Teflon (Teflon), editing status: Dec. 19, 2017.
Wikipedia: Trennmittel (Release agent), editing status: Jul. 25, 2017.
Wikipedia: Kaolin (Kaolinite), editing status: Oct. 28, 2017.

* cited by examiner

METAL COMPONENT AND METHOD FOR PRODUCING SAME

CROSS-REFERENCES TO RELATED APPLICATIONS

This application is the U.S. National Stage of International Application No. PCT/EP2019/053747, filed Feb. 14, 2019, which designated the United States and has been published as International Publication No. WO 2019/158668 A1 and which claims the priority of German Patent Application, Serial No. 10 2018 103 319.2, filed Feb. 14, 2018, pursuant to 35 U.S.C. 119(a)-(d).

BACKGROUND OF THE INVENTION

The invention relates to a method for producing a metal component which is coated by a hard-material coating, which method comprises the steps of preparing an anti-caking agent, adding the prepared anti-caking agent to a powder mixture, providing the powder mixture, providing the substrate made of metal, heating the powder and the substrate in a heating device, depositing a coating on the substrate, the coating having a higher hardness than the substrate, and cooling the substrate. The invention also relates to a metal component having a hard-material coating.

Prior Art

Articulated link chains having chain members interconnected by means of a chain link in each case are used in many forms. In use as drive or conveyor chains, the region of the chain links in particular is so heavily loaded that a wear-resistant bearing surface is required. It is also useful, in particular with regard to high numbers of parts, to replace costly solutions with economical coating methods and processes.

DE 10 2005 047 449 A1 proposes an articulated link chain which has improved wear, the chain studs or chain sleeves of which are provided with hard-material coatings. These coatings are applied using a physical vapor deposition (PVD) method. The hard-material coating has a thickness of from 1 to 10 μm, and can additionally be surrounded by a lubricant coating, e.g. PTFE.

DE 10 2006 052 869 A1 describes an articulated chain in which the link surface of the stud and of the sleeve is provided with a PVD hard-material coating. In this case, the studs and the sleeve consist of a high-carbon steel having a carbon content of between 0.4 wt. % and 1.2 wt. %.

DE 10 2011 006 294 A1 proposes a method for producing a hardened coated metal component. The metal component is heat-treated in order to concentrate carbon and/or nitrogen in the outer layer, and then quenched to a temperature below martensite formation. The metal component is then tempered at a temperature higher than the temperature at which the subsequent coating process takes place. The coating itself is carried out using a chemical vapor deposition (CVD) or PVD method.

DE 10 2013 222 244 A1 describes a link plate for a chain which is provided with a friction-reducing tribological coating. The coating is applied using a PVD or PACVD method.

DE 10 2016 215 709 A1 discloses chain components such as sleeves, plates, studs and rollers made of steel which are provided with a wear-reducing CrN coating. The CrN coating is produced using a CVD process. The nitrogen in this case is obtained from the steel, which can optionally be nitrided before the treatment.

A link for a roller chain or sleeve-type chain is proposed in WO 2014019699. A nitride or carbide hard-material coating is applied to the link using a PVD or CVD method.

The aforementioned solutions for producing a hardened, coated metal component have disadvantages. PVD processes require a working pressure of 10-4 to 10 Pa and are conducted at working temperatures of several hundred ° C., depending on the type of coating. PVD processes therefore place high demands on the coating chamber. Moreover, they are not suitable for bulk material. The substrate and the material to be deposited (target) are spatially separated in the coating chamber. PVD processes are so-called line-of-sight process, i.e. only surfaces visible from the target are coated. Internal surfaces or bores are coated more thinly. Furthermore, when an anti-caking agent is used, all powder processes carry the risk of constituents of the anti-caking agent becoming embedded in the hard-material coating. This can result in damage to the hard-material coating and impair the performance of said coating.

The problem addressed by the present invention is therefore to provide a method for producing a hardened, coated metal component, preferably a steel component, in particular a metal nitride or metal carbide coating which is simple to use, allows high numbers of parts to be coated per unit of time and is economical to apply. At the same time, a sufficiently high quality of the hard-material coating is ensured because, when anti-caking agents are used, constituents of anti-caking agents are prevented from becoming embedded in the hard-material coating.

SUMMARY OF THE INVENTION

According to one aspect of the invention, the problem is solved by a method as described hereinafter and according to another aspect of the invention the problem is solved by a metal component as described hereinafter. Other advantageous embodiments of the invention are set out in the subclaims.

The method according to the invention for producing a metal component coated by a hard-material coating has up to seven method steps. In the first method step, an anti-caking agent is prepared. In the second method step, the prepared anti-caking agent is added to a powder mixture. In the third method step, the powder mixture is provided.

In the fourth method step, the substrate consisting of a metal is provided. In the fifth method step, the powder mixture and the substrate are heated up in a heating device. In the sixth method step, a coating is deposited on the substrate. The deposited coating has a higher hardness than the substrate. In the seventh method step, the substrate is cooled. The method steps hardening, tempering and barrel-polishing can also follow afterwards.

Using chemical vapor deposition (CVD), a hard coating is deposited on the substrate made of carbon-containing steel, which coating is highly wear-resistant and abrasion-resistant, has a high hardness, is highly temperature-resistant, has low friction, and has good chemical properties and a low adhesion tendency. In addition to improving the wear resistance, the hard-material coating also increases the corrosion resistance. Carbon-containing steels are preferably used for the substrate, since these steels have sufficient strength and good tempering properties. Both metal and non-metal hard materials can be used for the hard-material coating. The hard-material coating is preferably made of, inter ala, carbides, nitrides, carbonitrides, borides and silicides of transition elements, e.g. vanadium, chromium, tungsten, zirconium and titanium. Diamond and diamond-like carbon (DLC), as well as corundum, boron carbide, cubic boron nitride, silicon carbide or aluminum nitride are suitable as non-metal hard materials. In a preferred embodiment of the invention, the substrate is a steel substrate and the hard-material coating is a carbide, nitride and/or carbonitride coating.

The CVD method offers advantages in comparison with the PVD method for producing a hard-material coating known from the prior art. Compared with the PVD method, the CVD method is suitable for bulk material and has economic advantages with respect to plant engineering, operation and process technology: the substrate to be coated is mixed with the powder in a tumbler, for example. The coating process is carried out for several hours at a particular process temperature. All accessible surfaces of the substrate are evenly coated, including narrow bores. At the end of the coating process, the coated substrate is cooled. In a PVD method, the substrate and the material to be deposited are disadvantageously spatially separated; the coating is carried out by vaporizing the material to be deposited at working pressures of from 10-4 to 10 Pa.

In particular, the powder mixture has an inert anti-caking agent, e.g. $Al_2O_3$. The anti-caking agent keeps the powder mixture dry so as to avoid clumping. Moreover, partial sintering and fusion of metal is prevented during the coating process. Particles of the anti-caking agent become incorporated in the hard-material coating during the CVD process and thus prevent the formation of a homogenous hard-material coating. There are essentially two options for keeping the content of anti-caking agent in the hard-material coating as low as possible: to reduce the content of anti-caking agent in the powder mixture, and to prepare the anti-caking agent such that the particle size distribution of the anti-caking agent in the powder mixture is as large as possible and has only a small fines content. Large particles can be more easily removed than small particles from the hard-material coating by the mechanical friction during the coating process as soon as they adhere to the substrate.

Further embodiments of the invention for the hard-material coating are set out in subclaims 2 to 9.

In another embodiment of the invention, the content of anti-caking agent in the powder mixture is less than or equal to 50 wt. %, preferably less than or equal to 25 wt. % and particularly preferably less than or equal to 20 wt. %. The content of anti-caking agent in the powder mixture is kept as low as possible so as to prevent the anti-caking agent from being incorporated in the hard-material coating.

In a development of the invention, the content of Al in the hard-material coating is below 10 at. %, preferably below 5 at. % and particularly preferably below 3 at. %.

In another embodiment of the invention, the method step of preparing an anti-caking agent involves changing the particle size distribution. The anti-caking agent is prepared such that the particle size distribution of the anti-caking agent in the powder mixture is as large as possible. Large particles can be more easily removed than small particles from the hard-material coating by the mechanical friction during the coating process as soon as they adhere to the substrate. Smaller particles of the anti-caking agent are also more easily surrounded by a growing coating and embedded in the hard-material coating.

In another embodiment of the invention, the particle size distribution is changed by sieving, sedimentation, filtration and/or centrifugation, air classification and/or pneumatic classification.

In another embodiment of the invention, preparing the anti-caking agent involves washing the anti-caking agent. Washing is necessary for sedimenting or filtering and drying the anti-caking agent to change the particle size distribution.

In another aspect of the invention, the anti-caking agent has a content of particles having a particle size smaller than 20 µm of less than 25%, preferably less than 15% and particularly preferably less than 10%. The content of particles having a size over 20 µm should be as high as possible, because large particles can be more easily removed than small particles from the hard-material coating as soon as they adhere to the substrate by the mechanical friction during the coating process.

In another embodiment of the invention, the anti-caking agent has a content of particles having a particle size smaller than 10 µm of less than 20%, preferably less than 12% and particularly preferably less than 8%. When the coating has the usually achieved coating thickness of 1-25 µm, smaller particles of the anti-caking agent cannot be detached as soon as they adhere to the substrate, or can be detached only with difficulty. The content of these particularly small particles smaller than 10 µm is therefore set as low as possible.

In another embodiment of the invention, the anti-caking agent contains $Al_2O_3$. $Al_2O_3$ is an inert solid with a high melting point and high hardness, and prevents partial sintering. $Al_2O_3$ is also available at a low cost. Other possible anti-caking agents are kaolin (aluminum silicate), mullite (aluminum oxide and silicon oxide), zirconium oxide, nitride or silicide ceramics and/or any other ceramic inert substances.

In another embodiment of the invention, the process temperature of the method according to the invention is at least partly higher than 450° C., preferably higher than 500° C. and particularly preferably higher than 550° C. These high temperatures are necessary to allow the reaction in the CVD method for forming the hard-material coating to take place.

The metal component according to the invention which is coated by a hard-material coating has a substrate made of steel and a hard-material coating made of a metal carbide and/or a metal nitride or mixtures thereof. The hard-material coating also has particles of an anti-caking agent. According to the invention, the surface content of particles of the anti-caking agent in the hard-material coating, which is determined by a micrograph of the hard-material coating, is less than 15%, preferably less than 10% and particularly preferably less than 5%. As a result of preparing the anti-caking agent by sieving, for example, the surface content of the particles of the anti-caking agent in the hard-material coating is reduced in comparison with the solutions known from the prior art, and therefore achieves a significantly more homogenous hard-material coating.

Further embodiments of the invention concerning the metal component are set out in subclaims.

In a development of the invention, the content of Al in the hard-material coating is less than 10 at. %, preferably less than 5 at. % and particularly preferably less than 3 at. %.

In another embodiment of the invention, the substrate is a chain component, e.g. an inner and/or outer plate, a sleeve and/or a stud of a chain component. The chain has outer plates which are connected by inner plates, Studs are rotatably mounted in a sleeve in each case. Studs and sleeves are subjected to high wear during operation and therefore particularly suitable for being coated by a hard-material coating. The hard-material coating on the link surface of the stud and/or the sleeve has a coating thickness of between 1 and 40 µm. Despite this small coating thickness, these hard-material coatings on the link surface of the stud and/or the sleeve protect against corrosion and have good wear resistance. It is sufficient in this case for the contact region between the stud and the sleeve to be provided with the hard-material coating.

In another embodiment of the invention, the substrate is a chain component, e.g. an inner and/or outer plate, a sleeve and/or a stud of a chain component. The chain has outer plates which are connected by inner plates, Studs are rotatably mounted in a sleeve in each case. Studs and sleeves are subjected to high wear during operation and therefore particularly suitable for being coated by a hard-material coating. In comparison with conventional protective coatings, when a hard-material coating is used for a chain it is sufficient for the hard-material coating on the link surface of the stud and/or the sleeve to have a coating thickness of between 1 and 40 µm. Despite this small coating thickness, these hard-material coatings on the link surface of the stud and/or the sleeve have good protection against corrosion and good wear resistance. It is sufficient in this case for the contact region between the stud and the sleeve to be provided with the hard-material coating.

In another embodiment of the invention, the substrate is a chain component, e.g. an inner and/or outer plate, a sleeve and/or a stud of a chain component. The chain has outer plates which are connected by inner plates, Studs are rotatably mounted in a sleeve in each case. Studs and sleeves are subjected to high wear during operation and therefore particularly suitable for being coated by a hard-material coating. In comparison with conventional protective coatings, when a hard-material coating is used for a chain it is sufficient for the hard-material coating on the link surface of the stud and/or the sleeve to have a coating thickness of between 1 and 40 µm. Despite this small coating thickness, these hard-material coatings on the link surface of the stud and/or the sleeve have good protection against corrosion and good wear resistance. It is sufficient in this case for the contact region between the stud and the sleeve to be provided with the hard-material coating. In a preferred embodiment of the invention, the chain component is made of a carbon-containing steel.

BRIEF DESCRIPTION OF THE DRAWING

Embodiments of the sensor device and the method according to the invention are shown schematically and in a simplified manner in the drawings, and explained in more detail in the following description.

In the drawings.

DETAILED DESCRIPTION OF PREFERRED EMBODIMENTS

Embodiments of the method according to the invention for producing a metal component coated by a hard-material coating and embodiments of a metal component coated by a hard-material coating according to the invention are shown schematically and in a simplified manner in the drawings, and explained in more detail in the following description.

Figure 1:
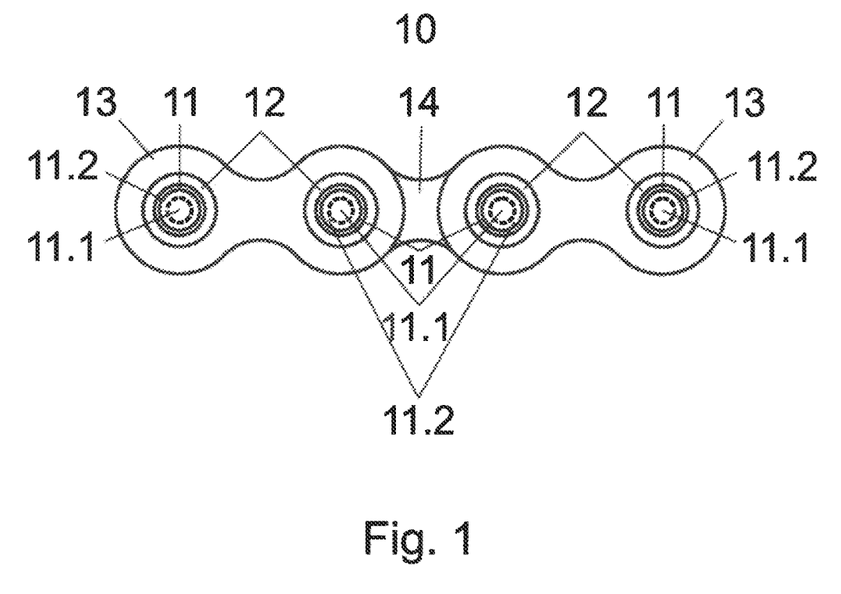
FIG. 1 shows the design of a chain for use in chain drives.

FIG. 1 shows two chain members of a chain 10, which can be used in chain drives, for example. The chain 10 is designed as a sleeve-type chain, comprising inner chain members and outer chain members which are connected via a chain link in each case. The inner chain link consists of two inner plates 13 which extend in parallel and two sleeves 12 which connect the inner tabs 13 to one another, the sleeves 12 being perpendicular to the inner plate 13.

The outer chain members 14 consist of two outer plates 14 which extend in parallel and are interconnected by means of two studs 11, the studs 11 being rotatably mounted in the sleeves 12 of the inner chain members 13. The outer chain member 14 is rotatably fastened to an adjacent inner chain member 13 by the stud 11, and connects the inner chain member 13 to a second inner chain member 13 by means of the outer plates 14, the outer plates 14 extending in parallel with the inner plates 13. The studs 11 of the outer chain member 14 are rotatably mounted in the sleeves 12 of the inner chain member 13, the connection of a chain link of the chain 10 being formed thereby in each case. The studs 11 of the chain 10 consist entirely of a steel, e.g. 100Cr6, the link surface of the stud 11 being provided with a hard-material coating applied using a CVD method. Alternatively or in addition, the sleeve 12 can also be produced from a steel and provided with a CVD hard-material coating on the link surface or bearing surface thereof.

The coating method according to the invention of studs 11 of a chain member, which studs consist of a 100Cr6 steel, is described below by way of example. The anti-caking agent 1 is washed, sedimented and dried before the coating process begins so as to separate the fines content.

For comparison, the coating method is carried out on the same substrate using an anti-caking agent 1 which has not been prepared, as is known from the prior art. The anti-caking agent is $Al_2O_3$ in both cases. The non-prepared anti-caking agent 1 displays the following particle size distribution in the sieve analysis: 0-5%>0.2 mm, 5-15% 0.125-0.2 mm, 65-80% 0.063-0.125 mm, 0-15% 0.04-0.063 mm, 0-10%<0.04 mm. Particles having a particle size of 63-125 µm therefore form the highest proportion in the anti-caking agent 1. Ammonium chloride is also added as activator 2 in a proportion of 0.4%.

The studs 11 are pretreated by hardening for both embodiments. 80 kg of studs 11 is mixed with 37 kg of powder and 37 kg of anti-caking agent and coated in a rotary drum at 7 rpm and 950° C. in an oxygen-free nitrogen atmosphere at normal pressure for 6 hours. The powder has between 20 and 30% Fe and 70 to 80% V. After being coated, the studs 11 are cooled in an air cooling chamber. The aim of the coating process is a VC hard-material coating which is as homogenous as possible and has a content of anti-caking agent 1 which is as low as possible.

Figure 2:
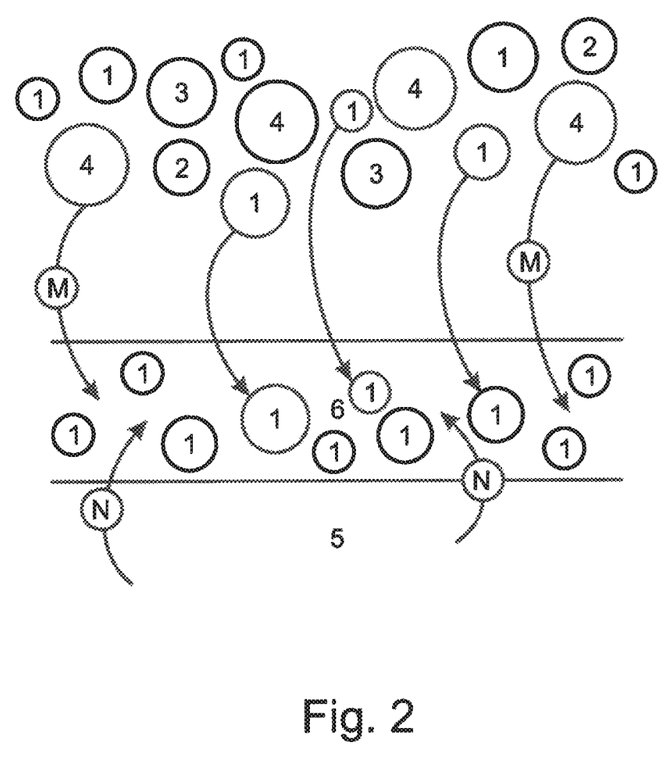
FIG. 2 shows the process of hard-material coating formation using a CVD method from the prior art, without prior preparation of the anti-caking agent.

FIG. 2 schematically shows the process of hard-material coating formation during the CVD process, as is known from the prior art. The powder has the constituents anti-caking agent 1, activator 2, Fe 3 and V 4. The bulk material 5, which is hardened before the coating process, is provided with a hard-material coating 6 during the CVD process. The hard-material coating 6 is formed by the metal which originates from the powder and the carbon which originates from the bulk material 5. Moreover, particles of the release material 1 are embedded in the hard-material coating 6. The particle size of the particles of the anti-caking agent 1 vary greatly, indicated by the varying diameter of the particles.

The content of the anti-caking agent 1 in the hard-material coating 6 is also high, indicated by the number of particles of the anti-caking agent 1. This schematic representation is confirmed by the micrograph (FIG. 4).

Figure 3:
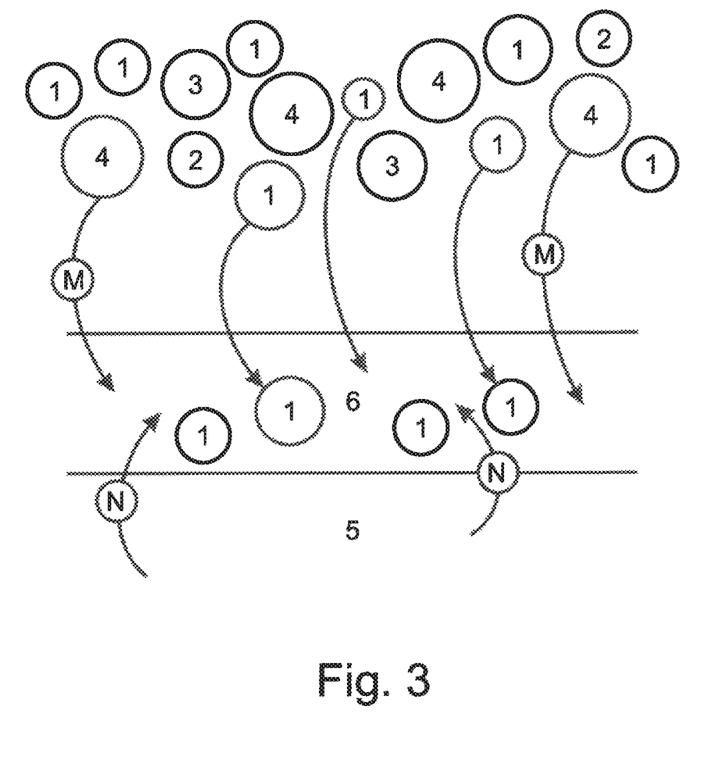
FIG. 3 shows the process of hard-material coating formation using a CVD method according to the invention, with prior preparation of the anti-caking agent.

FIG. 3 shows a process of hard-material coating formation during the method according to the invention. The powder has the constituents anti-caking agent 1, activator 2, Fe 3 and V 4. The bulk material 5 is provided with a hard-material coating 6 during the CVD process. The hard-material coating 6 is formed by the metal which originates from the powder and the carbon which originates from the bulk material 5. Particles of the anti-caking agent 1 are also embedded in the hard-material coating 6. However, the particle size distribution of the particles of the anti-caking agent 1 is smaller than in the preceding embodiment, a consequence of the pretreatment of the anti-caking agent 1 by washing, sedimentation and drying. The smaller grain sizes of the anti-caking agent 1 are separated by the preparation process. The prepared anti-caking agent 1 displays the following particle size distribution in the sieve analysis: 0-5%>0.2 mm, 5-15% 0.125-0.2 mm, 65-80% 0.063-0.125 mm, 0-10% 0.04-0.063 mm, 0-5%<0.04 mm. The content of anti-caking agent 1 in the hard-material coating 6 is also significantly lower. This schematic representation is confirmed by the micrograph (FIG. 5).

Figure 4:
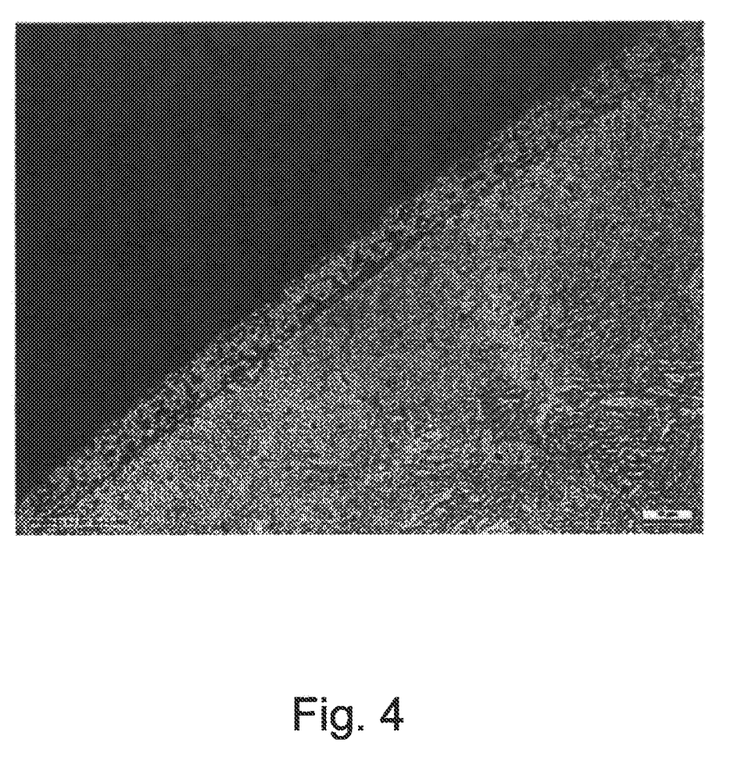
FIG. 4 shows a micrograph of the hard-material coating produced using a CVD method from the prior art without the anti-caking agent having been previously prepared.

FIG. 4 shows a micrograph of the hard-material coating 6 on a stud 11 as produced using the method known from the prior art, i.e. without preparing the anti-caking agent 1. The coating thickness of the hard-material coating 6 here is less than 10 µm. There are also inclusions of the anti-caking agent 1 in the hard-material coating 6, identifiable by the dark color. The surface content of the anti-caking agent 1 in the hard-material coating is approximately 18%, the diameter ranging between 0.1 and 2 µm.

Figure 5:
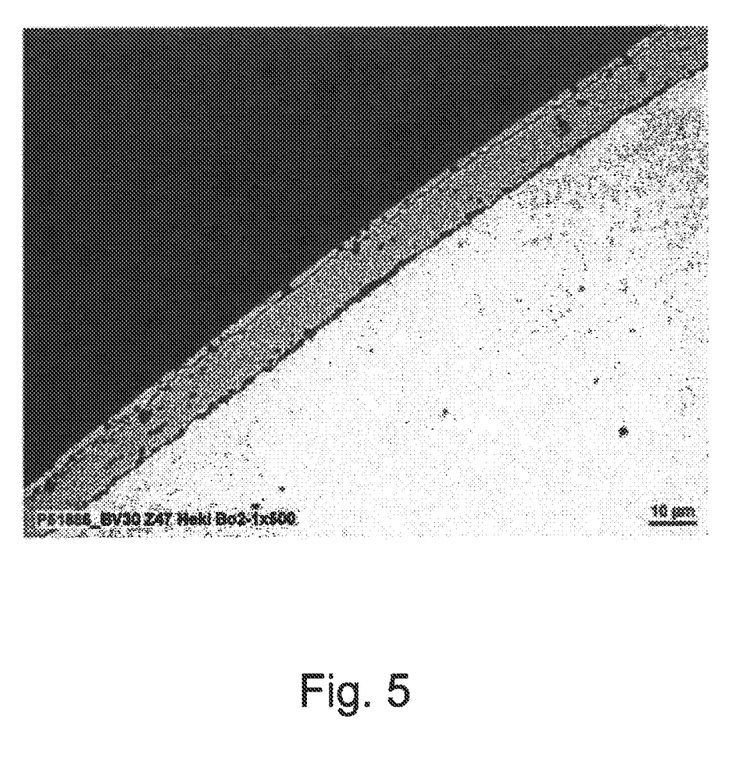
FIG. 5 shows a micrograph of the hard-material coating produced using a CVD method according to the invention with the anti-caking agent having been previously prepared.

FIG. 5 shows a micrograph of the hard-material coating 6 on a stud 11 as produced by the method according to the invention, i.e. with preparation of the anti-caking agent 1 by means of washing, sedimentation and drying. The coating thickness of the hard-material coating 6 in this embodiment is under 10 µm. There are also inclusions of the anti-caking agent 1 in the hard-material coating 6, identifiable by the dark color. The surface content of the anti-caking agent 1 in the hard-material coating 6 is approximately 2.5%, the diameter ranging between 0.1 and 2 µm. The content of anti-caking agent 1 in the hard-material coating 6 is significantly lower than without prior preparation of the anti-caking agent 1. The method according to the invention therefore produces a significantly more homogenous hard-material coating 6, using prepared anti-caking agents, and here in particular anti-caking agents of which the superfine constituents are separated from the powder used, than the solutions hitherto known from the prior art.

In another embodiment, the studs 11 are pretreated by hardening. 80 kg of studs 11 is mixed with 40 kg FeCr powder and 30 kg anti-caking agents, here $Al_2O_3$, and coated in a rotary drum at 7 rpm and 950° C. in an oxygen-free nitrogen atmosphere at normal pressure for 6 hours. The powder has between 20 and 30% Fe and 70 to 80% Cr. After being coated, the studs 11 are cooled in an air cooling chamber. The aim of the coating process is a CrN hard-material coating which is as homogenous as possible and has a content of anti-caking agent 1 which is as low as possible.

In this embodiment, the powder has the constituents anti-caking agent 1, activator 2, Fe 3 and Cr 4. The substrate material 5 is a carbon-containing steel and is provided with a hard-material coating 6 during the CVD process. The hard-material coating 6 is formed by the metal which originates from the powder and the nitrogen which originates from the atmosphere. Particles of the anti-caking agent 1 are also embedded in the hard-material coating 6. The anti-caking agent 1 is prepared by washing, sedimentation and drying, and content of the fraction of anti-caking agent having small particle sizes is separated. The remaining anti-caking agent powder is used in the powder mixture of the CVD process. The prepared anti-caking agent 1 displays the following particle size distribution in the sieve analysis: 0-5%>0.2 mm, 5-15% 0.125-0.2 mm, 65-80% 0.063-0.125 mm, 0-10% 0.04-0.063 mm, 0-5%<0.04 mm. The content of anti-caking agent 1 in the hard-material coating 6 is very low. An EDX analysis showed 4.5 at. % Al content in the hard-material coating.

What is claimed is:

1. A metal component, comprising:
   a substrate made of steel; and
   a hard-material coating made of a metal carbide or a metal nitride or mixtures thereof, said hard-material coating applied on a surface of the substrate and having embedded therein particles of an anti-caking agent containing aluminum silicate, aluminum oxide, silicon oxide, or zirconium oxide, wherein in a micrograph of the hard-material coating, the particles of the anti-caking agent embedded in the hard-material coating have a diameter between 0.1 and 2 µm and a surface content of less than 15%.

2. The metal component of claim 1, wherein the hard-material coating includes CrN, FeN or VN.

3. The metal component of claim 1, wherein the particles of the anti-caking agent embedded in the hard-material coating have a surface content of less than 10%.

4. The metal component of claim 1, wherein the particles of the anti-caking agent embedded in the hard-material coating have a surface content of less than 5%.

5. A chain component, comprising:
   an inner plate having a sleeve
   an outer plate extending in parallel with the inner plate, and
   a stud rotatably fastened in the sleeve of the inner plate and interconnecting the outer plate to an adjacent inner plate,
   wherein a link surface of the stud in contact with the sleeve comprises a hard material coating made of a metal carbide or a metal nitride or mixtures thereof, said hard-material coating applied on the link surface of the stud and having embedded therein particles of an anti-caking agent containing aluminum silicate, aluminum oxide silicon oxide, or zirconium oxide, wherein in a micrograph of the hard-material coating, a surface content of the particles of the anti-caking agent in the hard-material coating having a diameter between 0.1 and 2 µm is less than 5%.

* * * * *